United States Patent
Kobayakawa

(10) Patent No.: US 8,334,548 B2
(45) Date of Patent: Dec. 18, 2012

(54) SEMICONDUCTOR LIGHT EMITTING DEVICE

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 34 days.

(21) Appl. No.: 12/593,836

(22) PCT Filed: Mar. 25, 2008

(86) PCT No.: PCT/JP2008/055536
§ 371 (c)(1),
(2), (4) Date: Sep. 29, 2009

(87) PCT Pub. No.: WO2008/123232
PCT Pub. Date: Oct. 16, 2008

(65) Prior Publication Data
US 2010/0044737 A1    Feb. 25, 2010

(30) Foreign Application Priority Data
Mar. 30, 2007  (JP) .................................. 2007-092880

(51) Int. Cl.
*H01L 33/00* (2010.01)
*H01L 23/495* (2006.01)
*H01L 23/34* (2006.01)

(52) U.S. Cl. ............ 257/99; 257/98; 257/100; 257/670; 257/672; 257/676; 257/712; 257/E33.057; 257/E33.058; 257/E33.059; 257/E33.061; 257/E33.068; 257/E33.075

(58) Field of Classification Search .................. None
See application file for complete search history.

(56) References Cited

U.S. PATENT DOCUMENTS

| 6,084,252 | A | 7/2000 | Isokawa et al. | |
|---|---|---|---|---|
| 6,603,148 | B1 * | 8/2003 | Sano et al. | 257/98 |
| 6,747,293 | B2 | 6/2004 | Nitta et al. | |
| 7,045,905 | B2 | 5/2006 | Nakashima | |
| 7,187,063 | B2 | 3/2007 | Adachi et al. | |
| 7,499,288 | B2 | 3/2009 | Tanaka et al. | |
| 7,800,304 | B2 * | 9/2010 | Norfidathul et al. | 313/512 |
| 2005/0224829 | A1 * | 10/2005 | Negley et al. | 257/99 |
| 2007/0145403 | A1 * | 6/2007 | Tomioka et al. | 257/99 |
| 2007/0176190 | A1 * | 8/2007 | Takayama | 257/98 |
| 2007/0241362 | A1 * | 10/2007 | Han et al. | 257/100 |
| 2007/0262328 | A1 * | 11/2007 | Bando | 257/79 |

FOREIGN PATENT DOCUMENTS

| CN | 1652357 | 8/2005 |
|---|---|---|
| JP | 11-103097 | 4/1999 |
| JP | 11-346006 | 12/1999 |
| JP | 11-346008 | 12/1999 |
| JP | 2001-185763 | 7/2001 |
| JP | 2002-314143 | 10/2002 |

(Continued)

*Primary Examiner* — Hoang-Quan Ho
(74) *Attorney, Agent, or Firm* — Hamre, Schumann, Mueller & Larson, P.C.

(57) ABSTRACT

A semiconductor light emitting device (A) includes a lead frame (1) having a constant thickness, a semiconductor light emitting element (2) supported by the lead frame (1), a case (4) covering part of the lead frame (1) and a light transmitting member (5) covering the semiconductor light emitting element (2). The lead frame (1) includes a die bonding pad (11a) and an elevated portion (11b). The die bonding pad (11a) includes an obverse surface on which the semiconductor light emitting element (2) is mounted, and a reverse surface exposed from the case (4). The elevated portion (11b) is shifted in position from the die bonding pad (11a) in the direction normal to the obverse surface of the die bonding pad (11a).

17 Claims, 3 Drawing Sheets

FOREIGN PATENT DOCUMENTS

| | | |
|---|---|---|
| JP | 2003-110145 | 4/2003 |
| JP | 2003-209293 | 7/2003 |
| JP | 2004-95576 | 3/2004 |
| JP | 2004-128474 | 4/2004 |
| JP | 2005-33194 | 2/2005 |
| JP | 2005-294736 | 10/2005 |
| JP | 2006-4987 | 1/2006 |
| JP | 2006-319224 | 11/2006 |
| JP | 2007-36133 | 2/2007 |
| JP | 2007-67443 | 3/2007 |

* cited by examiner

SEMICONDUCTOR LIGHT EMITTING DEVICE

TECHNICAL FIELD

The present invention relates to a semiconductor light emitting device including a semiconductor light emitting element.

BACKGROUND ART

FIG. 6 illustrates an example of a conventional semiconductor light emitting device (see e.g. Patent Document 1). The illustrated semiconductor light emitting device X includes a lead frame 91, an LED chip 92, a case 93 and a light transmitting member 94. The lead frame 91 includes two frame elements 91A and 91B. The first frame element 91A is thicker than the second frame element 91B. The LED chip 92 is mounted on the obverse surface of the first frame element 91A. The LED chip 92 is connected to the second frame element 91B via a wire 95. The case 93 is made of e.g. a white resin. The light transmitting member 94 fills the space in the case 93 to cover the LED chip 92. The light transmitting member 94 is formed with a lens 94a for enhancing the directivity of the light emitted from the LED chip 92.

When the semiconductor light emitting device X is in operation, heat is generated at the LED chip 92. Since the heat hinders the stable operation of the semiconductor light emitting device X, the heat needs to be dissipated from the LED chip 92. To increase the thickness of the first frame element 91A may be a useful measure to promote the heat dissipation from the LED chip 92. However, to increase the thickness of the frame element 91A leads to an increase in the entire size of the semiconductor light emitting device X.

Patent Document 1: JP-A-2007-67443

DISCLOSURE OF THE INVENTION

The present invention has been proposed under the circumstances described above. It is, therefore, an object of the present invention to provide a semiconductor light emitting device that can be reduced in thickness while promoting the heat dissipation from the semiconductor light emitting element.

A semiconductor light emitting device provided according to the present invention includes a lead frame having a constant thickness, a semiconductor light emitting element supported by the lead frame, a case covering part of the lead frame, and a light transmitting member covering the semiconductor light emitting element. The lead frame includes a die bonding pad and an elevated portion. The die bonding pad includes an obverse surface on which the semiconductor light emitting element is mounted, and a reverse surface exposed from the case. The elevated portion is shifted in position from the die bonding pad in the direction normal to the obverse surface of the die bonding pad.

With this arrangement, the dimension from the semiconductor light emitting element to the reverse surface of the semiconductor light emitting device corresponds to the thickness of the lead frame. The lead frame is such a thin member that can be easily bent to form the elevated portion. Thus, the thickness of the semiconductor light emitting device can be reduced. Since the reverse surface of the die bonding pad on which the semiconductor light emitting element is mounted is exposed from the case, heat is efficiently dissipated from the semiconductor light emitting device to the outside. The elevated portion can be suitably used for bonding a wire, which is connected to the semiconductor light emitting element, by using a capillary or mounting an element such as a zener diode for enhancing the function of the semiconductor light emitting device.

Preferably, the lead frame includes an easily deformable portion connecting the die bonding pad and the elevated portion to each other. The easily deformable portion may include a rectangular frame-shaped portion and a first and a second bridge portions. The first bridge portion connects the frame-shaped portion and the die bonding pad to each other, whereas the second bridge portion connects the frame-shaped portion and the elevated portion to each other. With this arrangement, the elevated portion is formed easily and properly by bending a lead frame.

Other features and advantages of the present invention will become more apparent from the detailed description given below with reference to the accompanying drawings.

BEST MODE FOR CARRYING OUT THE INVENTION

Figure 1:
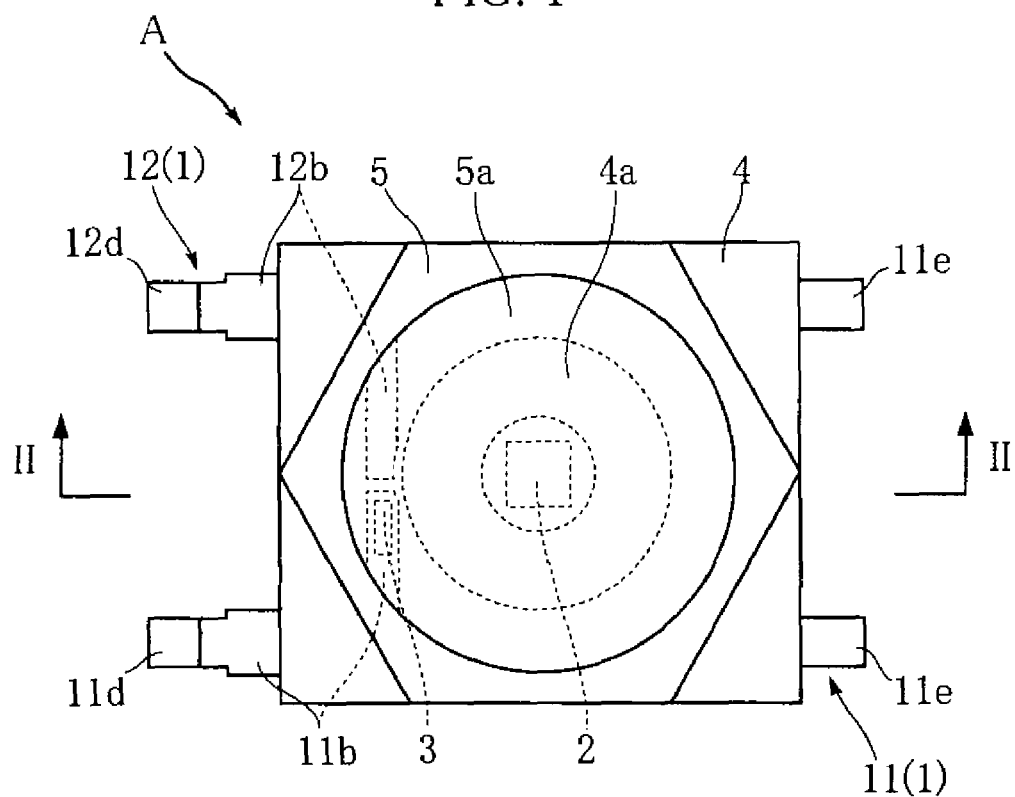
FIG. 1 is a plan view illustrating an example of a semiconductor light emitting device according to the present invention.
Figure 2:
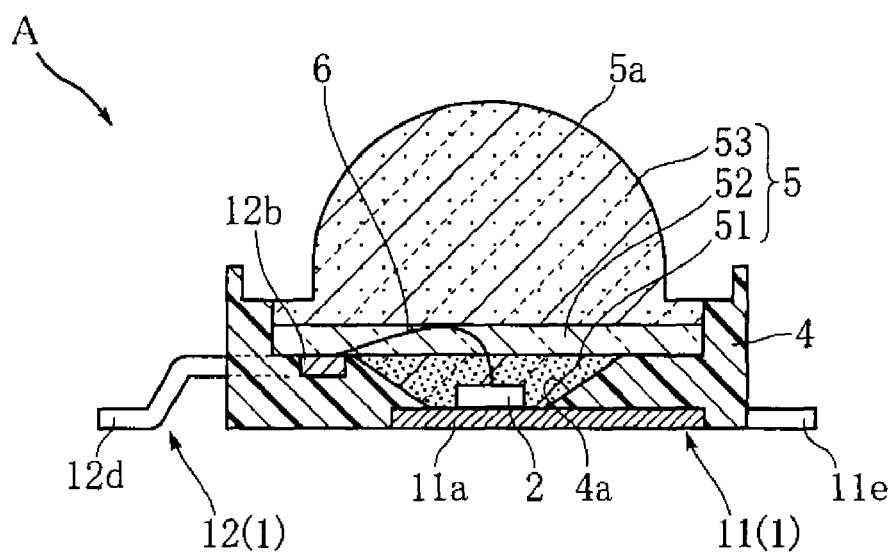
FIG. 2 is a sectional view taken along lines II-II in FIG. 1.
Figure 3:
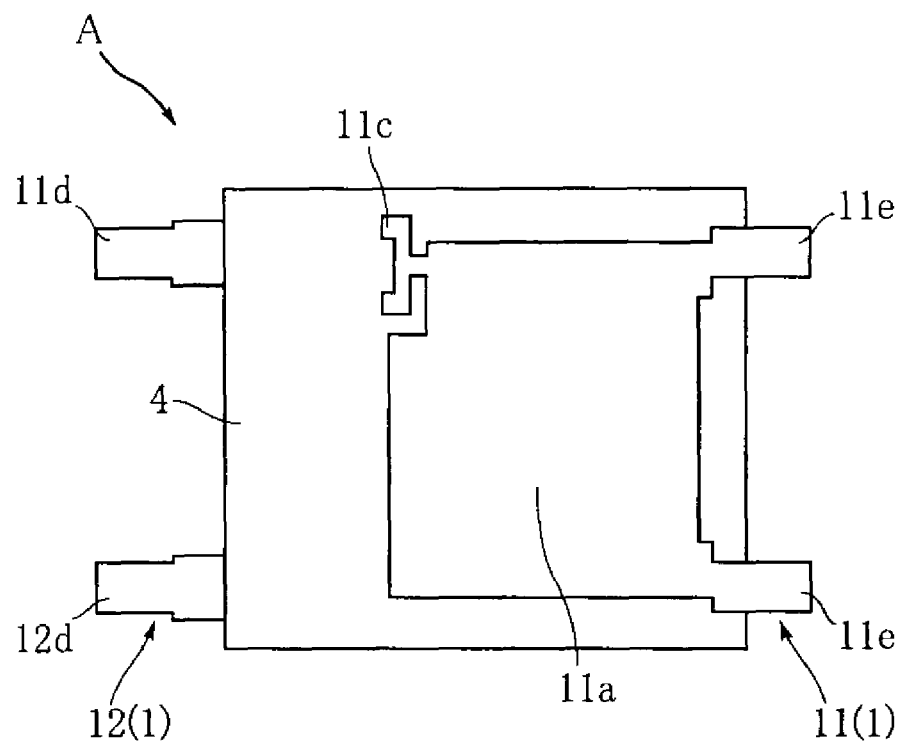
FIG. 3 is a bottom view illustrating the semiconductor light emitting device of the present invention.

FIGS. 1-3 illustrate an example of a semiconductor light emitting device according to the present invention. The illustrated semiconductor light emitting device A includes a lead frame 1, an LED chip 2, a zener diode 3, a case 4 and a light transmitting member 5.

The lead frame 1 is made of e.g. Cu, Ni or an alloy of these and includes a first frame element 11 and a second frame element 12. The lead frame 1 may be formed by punching a material plate and has a constant thickness.

Figure 4:
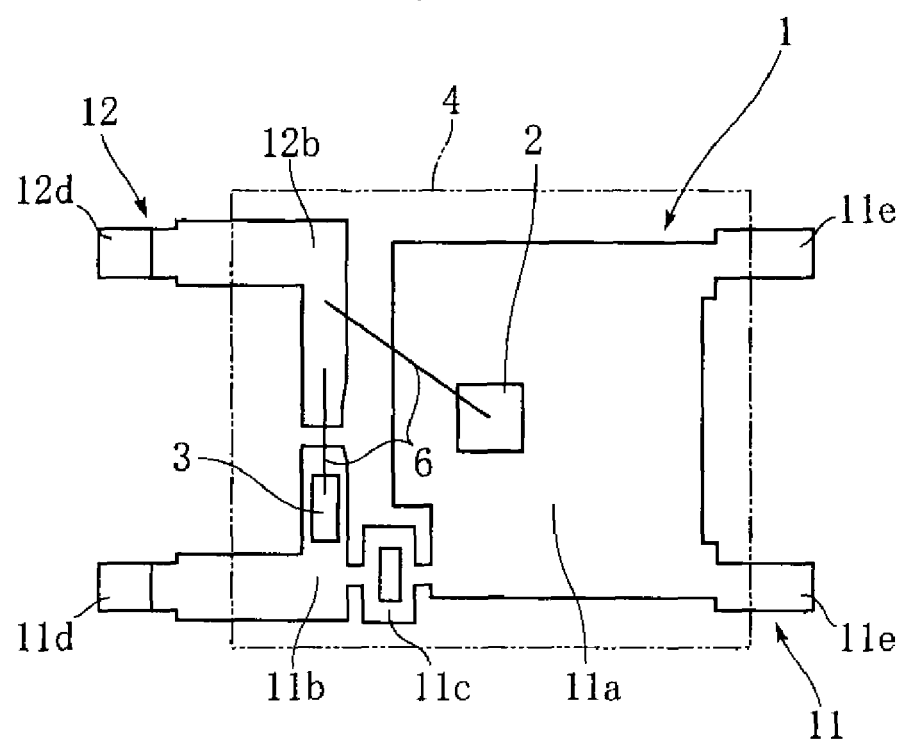
FIG. 4 is a plan view illustrating a lead frame of the semiconductor light emitting device of the present invention.
Figure 5:
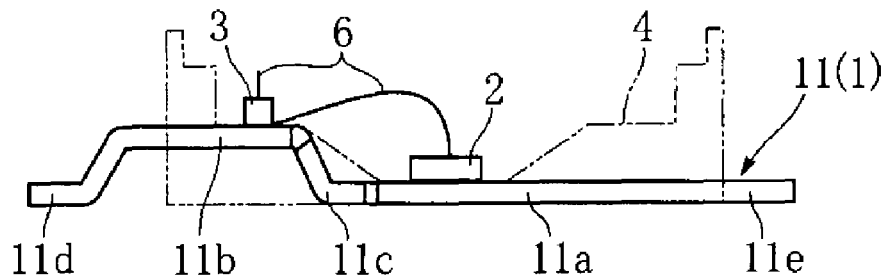
FIG. 5 is a side view illustrating the lead frame.
Figure 6:
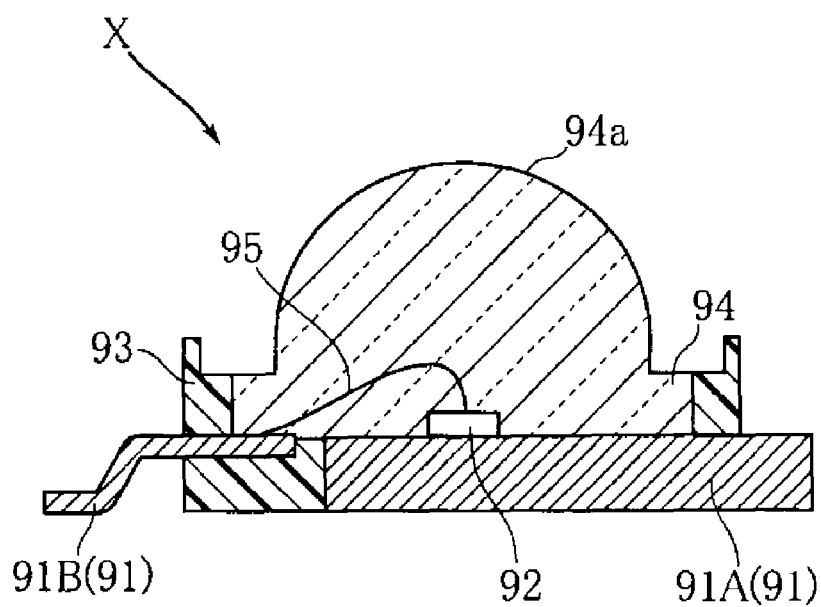
FIG. 6 is a sectional view illustrating an example of a conventional semiconductor light emitting device.

The structure of the lead frame 1 is illustrated in FIGS. 4 and 5. In these figures, the illustration of the light transmitting member 5 is omitted, and the case 4 is illustrated by phantom lines. As illustrated in these figures, the first frame element 11 includes a die bonding pad 11a, a first elevated portion 11b, an easily deformable portion 11c, a terminal 11d and two terminals 11e. The die bonding pad 11a is rectangular and has a relatively large area. The LED chip 2 is bonded on the obverse surface of the die bonding pad. The first elevated portion 11b, formed by e.g. bending, is shifted in position from other portions in the direction in which the obverse surface of the die bonding pad 11a is oriented (in the direction normal to the obverse surface). The easily deformable portion 11c connects the die bonding pad 11a and the first elevated portion 11b to each other. In the illustrated example, the easily deformable portion 11c includes a rectangular frame-shaped portion and two straight bridge portions. The first bridge portion connects the frame-shaped portion and the die bonding pad 11a to each other, whereas the second bridge portion connects the frame-shaped portion and the first elevated portion 11b to each other. The terminals 11d and 11e are the portions exposed from the case 4 and used for mounting the semiconductor light emitting device A to e.g. a circuit board. The terminals 11d and 11e are used as anode terminals. As illustrated in FIG. 3, the reverse surface of the die bonding pad 11a is exposed from the case 4. The easily deformable portion 11c is exposed from the case 4 at a portion adjacent to the die bonding pad 11a.

As illustrated in FIGS. 2 and 4, the second frame element 12 includes a second elevated portion 12b and a terminal 12d. The second elevated portion 12b, formed by e.g. bending, is shifted in position from other portions in the same direction as the first elevated portion 11b. In the illustrated example, the amount of shift of the first elevated portion 11b and that of the second elevated portion 12b are equal to each other. The terminal 12d is a portion exposed from the case 4 and used as a cathode terminal.

The LED chip 2 is the light source of the semiconductor light emitting device A and bonded to the obverse surface of the die bonding pad 11a. The LED chip 2 has a laminated structure of semiconductor layers made of e.g. GaN and emits light of a predetermined wavelength due to the recombination of electrons and holes in an active layer sandwiched between an n-type semiconductor layer and a p-type semiconductor layer. The LED chip 2 is connected to the elevated portion 12b via a wire 6.

The zener diode 3 is provided for preventing excessive voltage application to the LED chip 2. When a voltage exceeding a predetermined level is applied, the zener diode allows current to flow by zener breakdown. The zener diode 3 is mounted on the first elevated portion 11b and connected to the second elevated portion 12b via a wire 6.

The case 4 is made of e.g. a white resin and covers part of the lead frame 1, as illustrated in FIGS. 1-3. The case 4 is provided with a reflector 4a. The reflector 4a has a conical shape of which diameter increases as proceeding in the direction in which the obverse surface of the lead frame 1 is oriented and surrounds the LED chip 2. The light emitted laterally from the LED chip 2 is reflected by the reflector 4a in the direction in which the obverse surface of the lead frame 1 is oriented.

The light transmitting member 5 transmits the light emitted from the LED chip 2 and is made up of e.g. three resin layers 51, 52 and 53. The first resin layer 51 is made of silicone resin in which a fluorescent material is mixed. As the fluorescent material, use may be made of a material that emits yellow light by absorbing blue light emitted from the LED chip 2 as excitation light. The second resin layer 52 is made of transparent silicone resin. The third resin layer 53 is made of silicone resin in which a light scattering material is dispersed. The mixing of the blue light emitted from the LED chip 3 and the above-described yellow light is promoted in the third resin layer 3 so that clear white light is emitted from the third resin layer. The light transmitting member is formed with a lens 5a. The lens 5a refracts the light traveling from the LED chip 2 to enhance the directivity of the light.

The advantages of the semiconductor light emitting device A are described below. According to the above-described embodiment, the reverse surface of the die bonding pad 11a, on which the LED chip 2 is mounted, is exposed from the case 4. The dimension from the LED chip 2 to the reverse surface of the semiconductor light emitting device A corresponds to the thickness of the first frame element 11. The first frame element 11 is such a thin member that can be easily bent to form the first elevated portion 11b. Thus, the thickness of the semiconductor light emitting device A can be reduced.

The frame 1 may be made of the same material as that of a conventional frame. Even in such a case, heat dissipation from the LED chip 2 is promoted, because the die bonding pad 11a is exposed to the outside on the reverse surface side of the semiconductor light emitting device A.

Each of the first and the second elevated portions 11b and 12b, which is elevated to the obverse surface side of the frame 1, is partially exposed from the case 4. The exposed part of the second elevated portion 12b can be suitably used for the second bonding of a wire 6 using a capillary. The exposed part of the first elevated portion 11b can be suitably used for mounting an element such as a zener diode 3 for enhancing the function of the semiconductor light emitting device A.

The easily deformable portion 11c is a portion which can be easily bent in the direction in which the obverse surface of the frame 1 is oriented and can be stretched in the process of forming the first elevated portion 11b. Thus, in the bending process to form the first elevated portion 11b, the terminal 11d is prevented from deviating from the intended position toward the die bonding pad 11a.

The invention claimed is:

1. A semiconductor light emitting device comprising:
a lead frame having a constant thickness;
a semiconductor light emitting element supported by the lead frame;
a resin case covering part of the lead frame; and
a light transmitting member covering the semiconductor light emitting element;
wherein the lead frame includes a first frame element and a second frame element, the first frame element including a die bonding pad and a first terminal, the second frame element including an elevated portion and a second terminal,
wherein the first terminal and the second terminal project from a same side surface of the resin case,
wherein the die bonding pad includes an obverse surface on which the semiconductor light emitting element is mounted and a reverse surface exposed from the resin case,
wherein the first frame element includes an additional elevated portion that is offset with respect to the obverse surface of the die bonding pad in a direction normal to the obverse surface,
wherein the lead frame includes an easily deformable portion embedded in the resin case, the easily deformable portion connecting the bonding pad and the additional elevated portion, and
wherein the first frame element includes a third terminal and a fourth terminal, and the first terminal, the third terminal and the fourth terminal are flush with the die bonding pad.

2. A semiconductor light emitting device comprising:
a lead frame having a constant thickness;
a semiconductor light emitting element supported by the lead frame;
a resin case covering part of the lead frame; and
a light transmitting member covering the semiconductor light emitting element;
wherein the lead frame includes a first frame element and a second frame element, the first frame element including a die bonding pad and first terminal, the second frame element including an elevated portion and a second terminal,
wherein the first terminal and the second terminal project from a same side surface of the resin case,
wherein the die bonding pad includes an obverse surface on which the semiconductor light emitting element is mounted and a reverse surface exposed from the resin case, wherein the first frame element includes an additional elevated portion that is offset with respect to the obverse surface of the die bonding pad in a direction normal to the obverse surface, wherein the lead frame includes an easily deformable portion embedded in the resin case, the easily deformable portion connecting the die bonding pad and the additional elevated portion, and wherein the easily deformable portion includes a rectangular frame-shaped portion, a first bridge portion and a second bridge portion, the first bridge portion connecting the frame-shaped portion and the die bonding pad to each other, the second bridge portion connecting the frame-shaped portion and the additional elevated portion to each other.

3. The semiconductor light emitting device according to claim 1, wherein the elevated portion of the second frame element and the additional elevated portion are offset in a same direction.

4. The semiconductor light emitting device according to claim 1, wherein the elevated portion of the second frame element and the additional elevated portion are offset by a same amount.

5. A semiconductor light emitting device comprising:
a lead frame having a constant thickness;
a semiconductor light emitting element supported by the lead frame;
a resin case covering part of the lead frame; and
a light transmitting member covering the semiconductor light emitting element;
wherein the lead frame includes a first frame element and a second frame element, the first frame element including a die bonding pad and first terminal, the second frame element including an elevated portion and a second terminal,
wherein the first terminal and the second terminal project from a same side surface of the resin case,
wherein the die bonding pad includes an obverse surface on which the semiconductor light emitting element is mounted and a reverse surface exposed from the resin case,
wherein the first frame element includes an additional elevated portion that is offset with respect to the obverse surface of the die bonding pad in a direction normal to the obverse surface, and
wherein the lead frame includes an easily deformable portion embedded in the resin case, the easily deformable portion connecting the die bonding pad and the additional elevated portion,
the semiconductor light emitting device further comprising a zener diode and a wire, wherein the zener diode is mounted on the additional elevated portion and connected to the elevated portion of the second frame element by the wire.

6. The semiconductor light emitting device according to claim 1, further comprising a first resin covering the semiconductor light emitting element and containing a fluorescent material.

7. The semiconductor light emitting device according to claim 6, further comprising a second resin covering the first resin, wherein the second resin is transparent.

8. The semiconductor light emitting device according to claim 7, further comprising a third resin covering the second resin, wherein the third resin contains a light scattering material dispersed therein.

9. The semiconductor light emitting device according to claim 8, wherein the third resin is a lens form.

10. The semiconductor light emitting device according to claim 1, wherein the additional elevated portion includes a part exposed from the resin case on a same side of the obverse surface of the die bonding pad.

11. The semiconductor light emitting device according to claim 1, wherein the die bonding pad is rectangular.

12. The semiconductor light emitting device according to claim 11, wherein the easily deformable portion is adjacent to a vertex of the rectangular die bonding pad.

13. A semiconductor light emitting device comprising:
a lead frame having a constant thickness;
a semiconductor light emitting element supported by the lead frame;
a resin case covering part of the lead frame; and
a light transmitting member covering the semiconductor light emitting element;
wherein the lead frame includes a first frame element and a second frame element, the first frame element including a die bonding pad and first terminal, the second frame element including an elevated portion and a second terminal,
wherein the first terminal and the second terminal project from a same side surface of the resin case,
wherein the die bonding pad includes an obverse surface on which the semiconductor light emitting element is mounted and a reverse surface exposed from the resin case,
wherein the first frame element includes an additional elevated portion that is offset with respect to the obverse surface of the die bonding pad in a direction normal to the obverse surface,
wherein the lead frame includes an easily deformable portion embedded in the resin case, the easily deformable portion connecting the die bonding pad and the additional elevated portion, and
wherein the first frame element includes a third terminal and a fourth terminal both directly connected to the die bonding pad, and the die bonding pad, the third terminal and the fourth terminal are, as a whole, flat.

14. The semiconductor light emitting device according to claim 13, wherein each of the third terminal and the fourth terminal includes a reverse surface exposed from the resin case.

15. The semiconductor light emitting device according to claim 1, wherein the resin case is formed with a reflector enclosing the semiconductor light emitting element.

16. The semiconductor light emitting device according to claim 1, wherein the die bonding pad and the additional elevated portion are flat and parallel to each other.

17. The semiconductor light emitting device according to claim 1, wherein each of the first terminal, the third terminal and the fourth terminal includes a reverse surface flush with the reverse surface of the die bonding pad.

* * * * *